United States Patent
Zhu et al.

(10) Patent No.: US 7,691,690 B2
(45) Date of Patent: Apr. 6, 2010

(54) METHODS FOR FORMING DUAL FULLY SILICIDED GATES OVER FINS OF FINFET DEVICES

(75) Inventors: Huilong Zhu, Poughkeepsie, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 642 days.

(21) Appl. No.: 11/622,586

(22) Filed: Jan. 12, 2007

(65) Prior Publication Data

US 2008/0171408 A1 Jul. 17, 2008

(51) Int. Cl.
*H01L 21/00* (2006.01)
(52) U.S. Cl. .................... 438/157; 438/197; 438/241
(58) Field of Classification Search ........... 438/157, 438/197, 241
See application file for complete search history.

(56) References Cited

U.S. PATENT DOCUMENTS

| | | | |
|---|---|---|---|
| 6,764,884 B1 * | 7/2004 | Yu et al. | 438/157 |
| 6,831,310 B1 * | 12/2004 | Mathew et al. | 257/270 |
| 6,844,238 B2 * | 1/2005 | Yeo et al. | 438/424 |
| 6,855,990 B2 * | 2/2005 | Yeo et al. | 257/353 |
| 6,867,460 B1 * | 3/2005 | Anderson et al. | 257/351 |
| 6,951,783 B2 * | 10/2005 | Mathew et al. | 438/157 |
| 6,970,372 B1 * | 11/2005 | Furukawa et al. | 365/149 |
| 7,087,952 B2 * | 8/2006 | Zhu et al. | 257/315 |
| 7,091,566 B2 * | 8/2006 | Zhu et al. | 257/401 |
| 7,098,502 B2 * | 8/2006 | Mathew et al. | 257/308 |
| 7,105,934 B2 * | 9/2006 | Anderson et al. | 257/213 |
| 7,148,541 B2 * | 12/2006 | Park et al. | 257/347 |
| 7,393,733 B2 * | 7/2008 | Currie | 438/164 |
| 7,485,520 B2 * | 2/2009 | Zhu et al. | 438/197 |
| 7,564,081 B2 * | 7/2009 | Zhu et al. | 257/288 |
| 7,566,613 B2 * | 7/2009 | Furukawa et al. | 438/241 |
| 2005/0098822 A1 * | 5/2005 | Mathew et al. | 257/314 |
| 2005/0110085 A1 * | 5/2005 | Zhu et al. | 257/347 |
| 2006/0043616 A1 * | 3/2006 | Anderson et al. | 257/900 |
| 2006/0091450 A1 * | 5/2006 | Zhu et al. | 257/316 |
| 2006/0170066 A1 * | 8/2006 | Mathew et al. | 257/401 |
| 2007/0120154 A1 * | 5/2007 | Zhu et al. | 257/288 |
| 2008/0111185 A1 * | 5/2008 | Cheng | 257/347 |
| 2008/0171408 A1 * | 7/2008 | Zhu et al. | 438/157 |
| 2009/0057780 A1 * | 3/2009 | Wong et al. | 257/401 |

* cited by examiner

*Primary Examiner*—Laura M Menz
(74) *Attorney, Agent, or Firm*—Henri D. Schnurmann; Hoffman Warnick LLC

(57) ABSTRACT

Methods for forming fully silicided gates over fins of FinFet devices are disclosed. The disclosure provides methods for patterning a gate stack over each fin from a polysilicon layer and a polysilicon germanium layer, and then removing the polysilicon germanium layer over one of the fins. The disclosure further includes forming a metal layer over both fins and annealing the FinFet device to form fully silicided gates over each fin of the FinFet device.

10 Claims, 12 Drawing Sheets

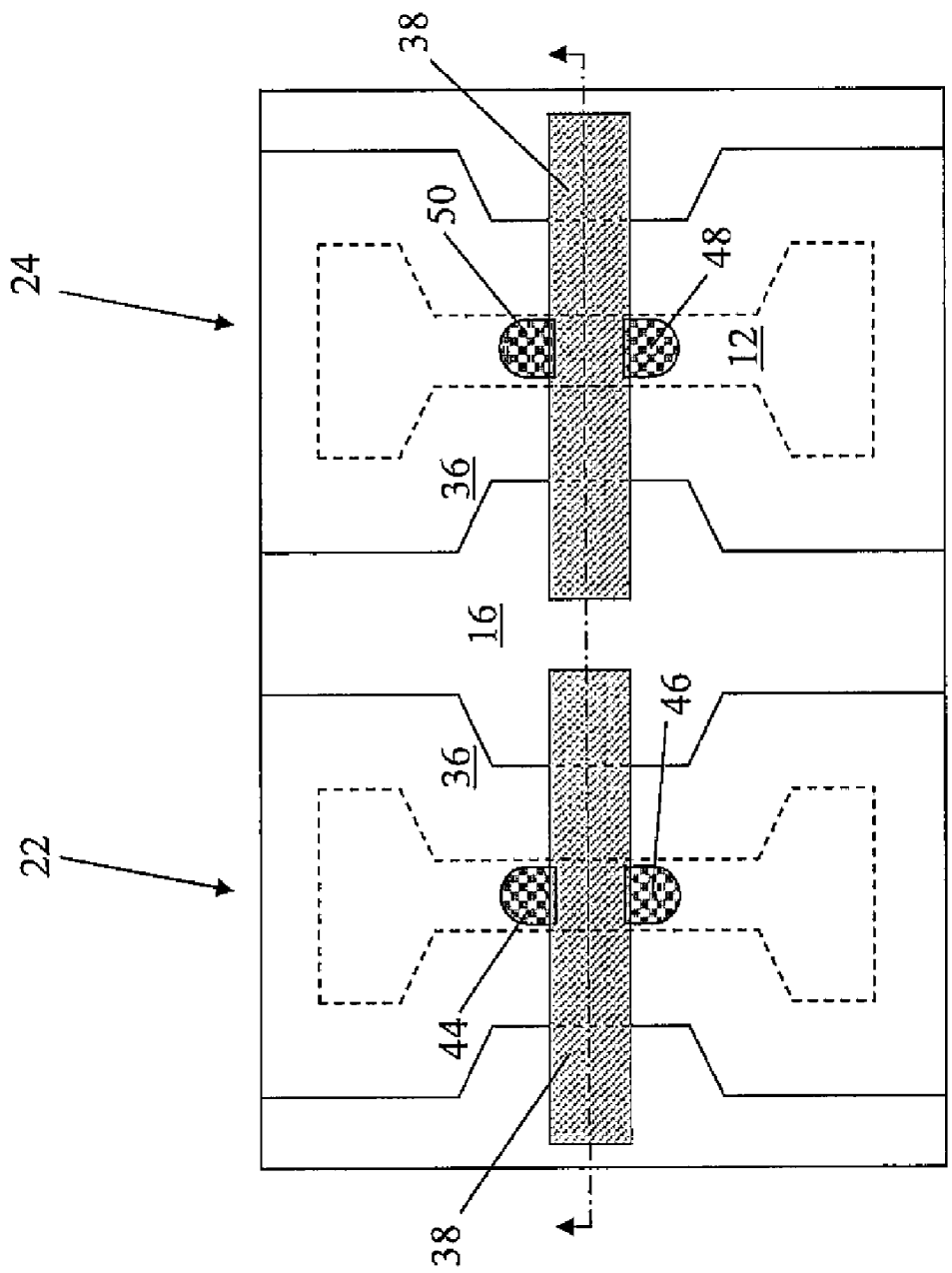

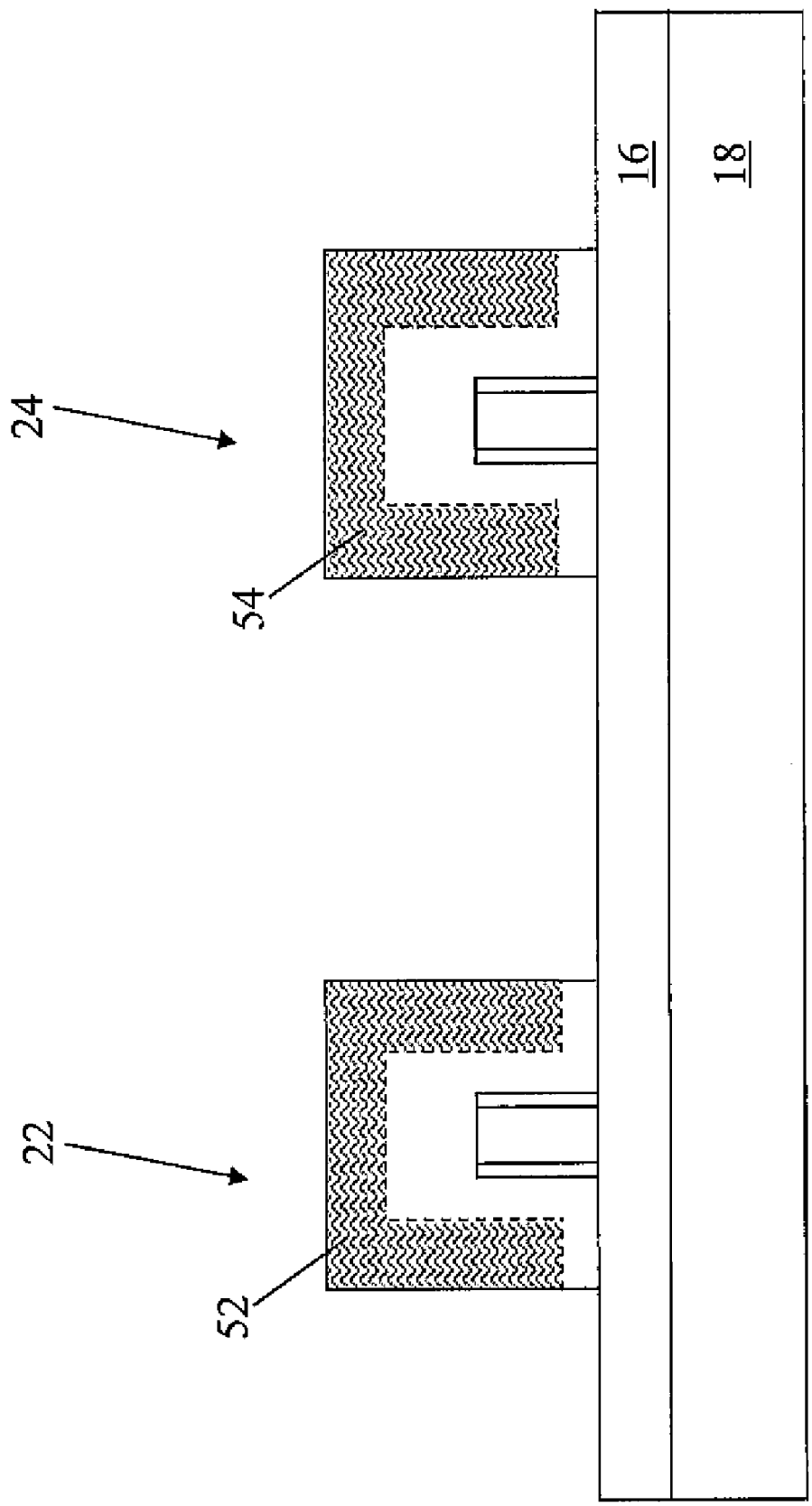

METHODS FOR FORMING DUAL FULLY SILICIDED GATES OVER FINS OF FINFET DEVICES

BACKGROUND OF THE DISCLOSURE

1. Technical Field

The disclosure relates generally to semiconductor fabrication, and more particularly, to methods for forming dual fully silicided gates over fins of FinFet devices.

2. Related Art

Silicide technology is important for improving the performance characteristics of semiconductor devices. Conventional silicide gate methodology comprises forming a semiconductor device with fully silicided gates to lower resistance and reduce the thickness of electrical gate dielectrics. This methodology has been applied to complementary metal-oxide-semiconductors (CMOS). Typically, CMOS devices with fully silicided gates are manufactured using chemical mechanical planarization (CMP) to remove various layers/materials covering the device gate in order to fully silicide the gate and obtain a desired threshold voltage. CMP involves using an abrasive and corrosive chemical slurry in conjunction with a polishing pad to remove the desired material from the device. However, current approaches to CMOS device manufacturing using CMP are inappropriate when applied to FinFet devices. In particular, given the structural characteristics of FinFets, manufacturing methods like CMP are severely damaging to the fins. Furthermore, accurately controlling the thickness of the remaining poly-silicon gate with CMP is more difficult for FinFet devices. As a result, a method for manufacturing FinFet semiconductor devices with dual fully silicided gates is currently unavailable.

SUMMARY OF THE DISCLOSURE

Methods for forming fully silicided gates over fins of FinFet devices are disclosed. The disclosure provides methods for patterning a gate stack over each fin from a polysilicon layer and a polysilicon germanium layer, and then removing the polysilicon germanium layer over one of the fins. The disclosure further includes forming a metal layer over both fins and annealing the FinFet device to form fully silicided gates over each fin of the FinFet device.

A first aspect of the disclosure is directed to a method comprising: providing a semiconductor-on-insulator (SOI) substrate having a first fin and a second fin formed from a SOI layer of the SOI substrate; forming a first polysilicon layer over each of the fins; forming a polysilicon germanium layer over the first polysilicon layer; patterning a gate stack over each fin from the first polysilicon layer and the polysilicon germanium layer; removing the polysilicon germanium layer over the second fin; forming a metal layer over both fins; and annealing to form a fully silicided gate over the first fin and the second fin, wherein the fully silicided gate over the second fin is metal rich.

A second aspect of the disclosure is directed to a method comprising: providing a semiconductor-on-insulator (SOI) substrate having a first fin and a second fin formed from a SOI layer of the SOI substrate, each fin having a silicon nitride cap and oxidized sidewalls, the SOI substrate further including a buried insulator layer; forming a first polysilicon layer over each of the fins; forming a polysilicon germanium layer over the first polysilicon layer; patterning a gate stack over each fin from the first polysilicon layer and the polysilicon germanium layer; removing the polysilicon germanium layer over the second fin; forming a nickel layer over both fins; annealing to form a fully silicided gate over the first fin and the second fin, wherein the fully silicided gate over the second fin is nickel rich.

A third aspect of the disclosure is directed to a method comprising: providing a semiconductor-on-insulator (SOI) substrate having a first fin and a second fin formed from a SOI layer of the SOI substrate, each fin having a silicon nitride cap and oxidized sidewalls, the SOI substrate further including a buried insulator layer; forming a first polysilicon layer over each of the fins; forming a polysilicon germanium layer over the first polysilicon layer; patterning a gate stack over each fin from the first polysilicon layer and the polysilicon germanium layer; forming a source region and a drain region adjacent to each fin; forming a silicon nitride spacer adjacent to each fin; removing the polysilicon germanium layer over the second fin; forming a nickel layer over both fins; annealing to form a fully silicided gate over the first fin and the second fin, wherein the fully silicided gate over the second fin is nickel rich.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

DETAILED DESCRIPTION

With reference to the accompanying drawings, FIGS. 1-9 illustrate embodiments of a method of forming dual fully silicided gates over fins of FinFet devices according to the disclosure.

Figure 1:
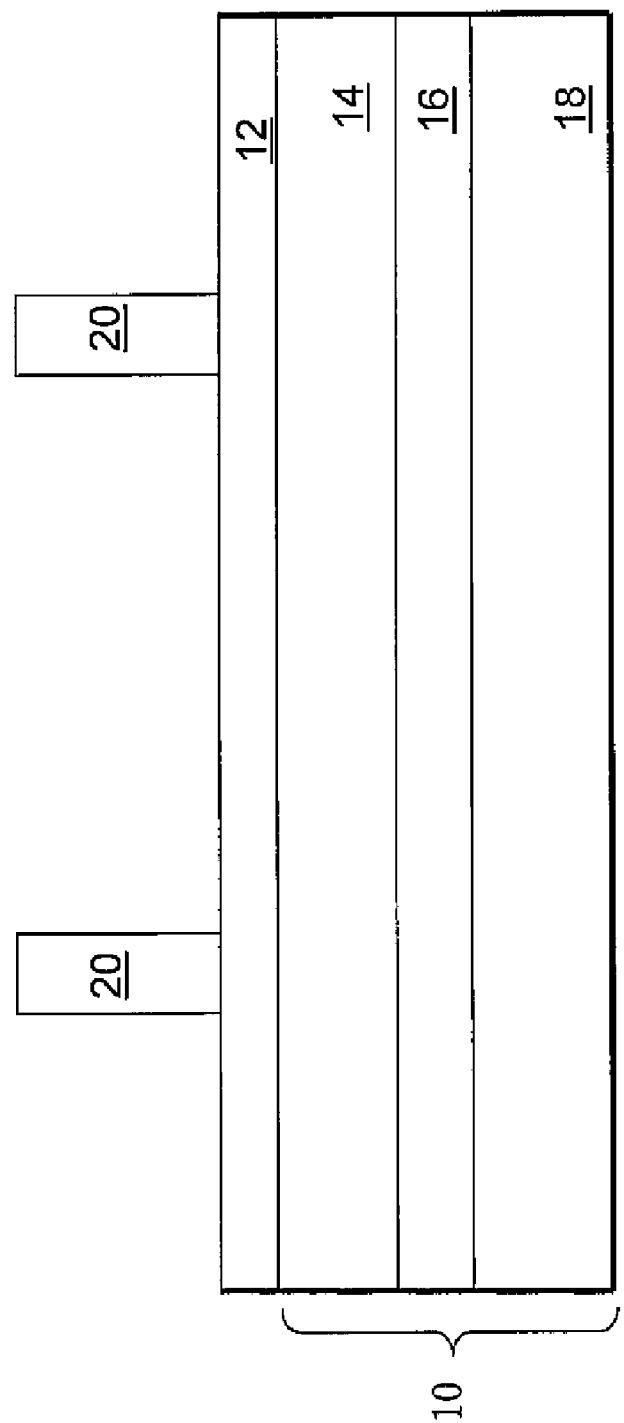
FIGS. 1-9 show embodiments of a method of forming dual fully silicided gates over fins of FinFet devices according to the disclosure.
Figure 2:
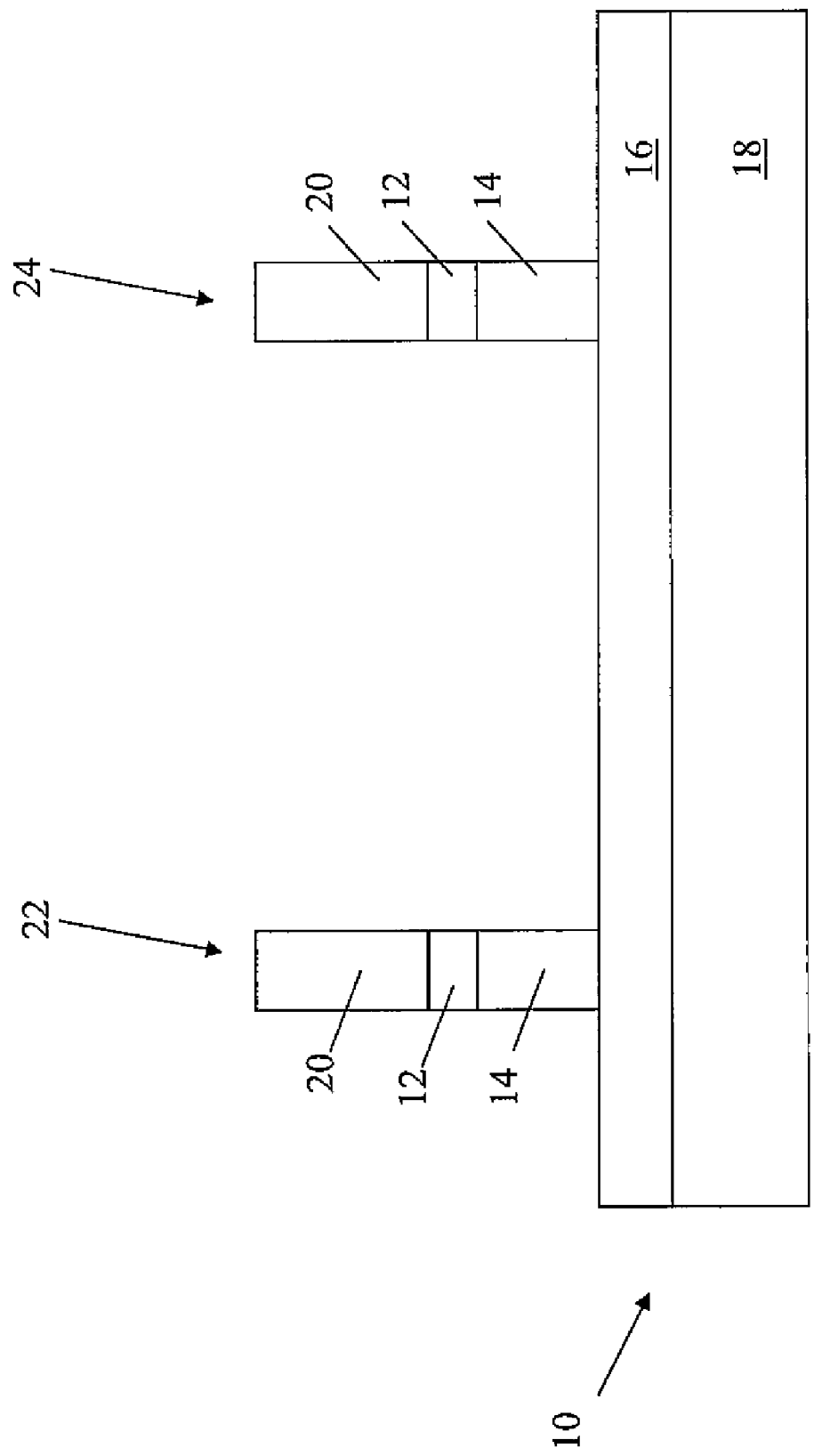
Figure 3:
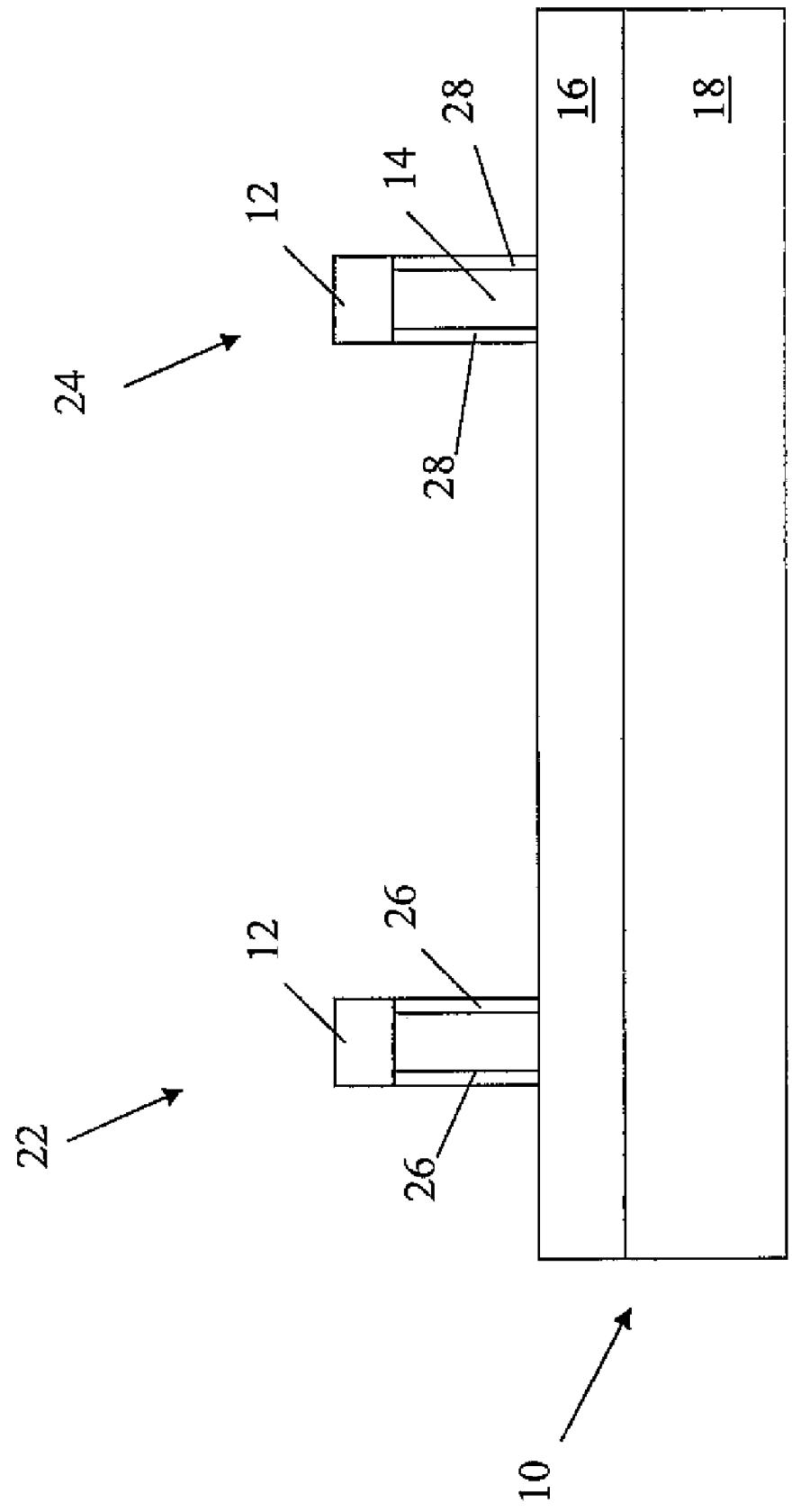

As shown in FIGS. 1-3, a first process includes providing a semiconductor-on-insulator (SOI) substrate 10 having a first fin 22 and a second fin 24 (FIGS. 2 and 3) formed from an SOI layer 14 of SOI substrate 10. As shown in FIG. 3, each fin 22, 24 has a silicon nitride cap 12 and oxidized sidewalls 26, 28. SOI substrate 10 also includes a buried insulator layer 16 over a bulk silicon layer 18.

In a first process, as shown in FIG. 1, silicon nitride cap 12 is deposited over a semiconductor-on-insulator (SOI) layer 14 of SOI substrate 10. SOI substrate 10 may include buried insulator layer 16. SOI layer 14 and/or bulk silicon layer 18 may include a number of materials, including silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In addition, SOI layer 14 and/or bulk silicon layer 18 may be doped with either an N-type impurity or P-type impurity in a conventional manner. N-type dopants may include but are not limited to: phosphorous (P), arsenic (As), antimony (Sb), while p-type dopants may include but are not limited to: boron (B), indium (In) and gallium (Ga).

As shown in FIG. 1, a photoresist mask 20 may be deposited and patterned using conventional photolithography techniques to expose the areas to begin formation of the fins, as will be described in more detail below. As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In a next process, as shown in FIG. 2, portions of silicon nitride cap 12 and SOI layer 14 left unexposed by photoresist mask 20 are removed, for example, by reactive ion etching (RIE). Etching extends through silicon nitride cap 12, SOI layer 14, and stops at buried insulator layer 16, thus forming silicon nitride covered fins 22, 24. The etching chemistry can be any now known or later developed recipe used for the above-described layers, e.g., a hydrogen-bromide (HBr) based chemistry.

In a next process, as shown in FIG. 3, photoresist mask 20 is removed, for example, using an oxygen ($O_2$) ash or solvent strip. Gate oxide layers 26, 28 are then formed over the sides of fins 22, 24 by conventional thermal oxidation techniques. Alternatively, a high-k dielectric material can be deposited to form gate dielectrics. The gate dielectric materials may include but are not limited to: hafnium silicate (HfSi), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Furthermore, examples of high-k material include but are not limited to metal oxides such as $Ta_2O_5$, $BaTiO_3$, $HfO_2$, $ZrO_2$, $Al_2O_3$, or metal silicates such as $Hf_{A1}Si_{A2}O_{A3}$ or $Hf_{A1}Si_{A2}O_{A3}N_{A4}$, where A1, A2, A3, and A4 represent relative proportions, each greater than or equal to zero and A1+A2+A3+A4 (1 being the total relative mole quantity).

Figure 4:
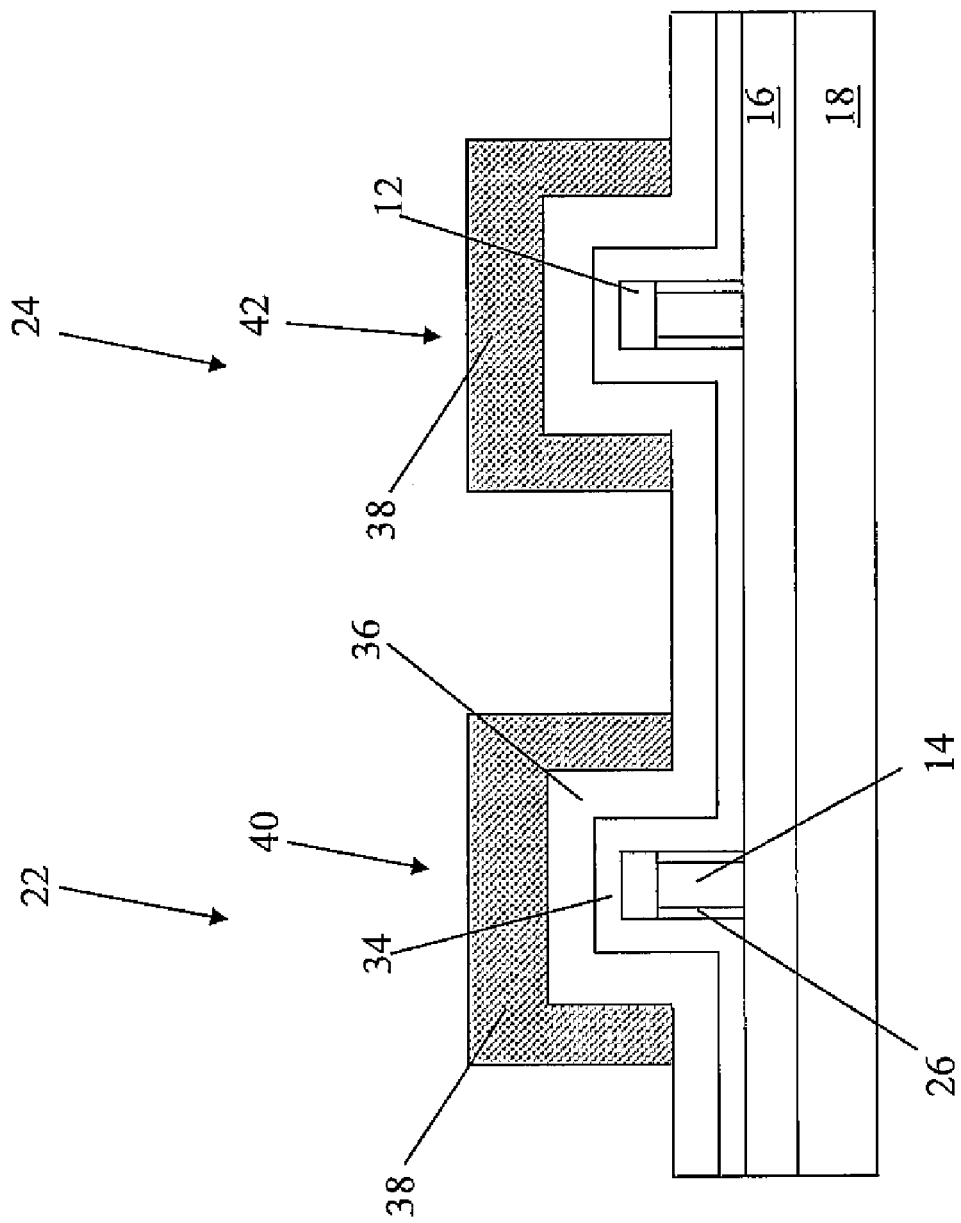

In a next process, as shown in FIG. 4, first polysilicon layer 34 is formed over each of fins 22, 24. Polysilicon germanium layer 36 is formed over first polysilicon layer 34, and photoresist mask 38 is deposited over polysilicon germanium layer 36 using conventional photolithography techniques to pattern gate stacks 40, 42 over each fin 22, 24 from first polysilicon layer 34 and polysilicon germanium layer 36.

Figure 5B:
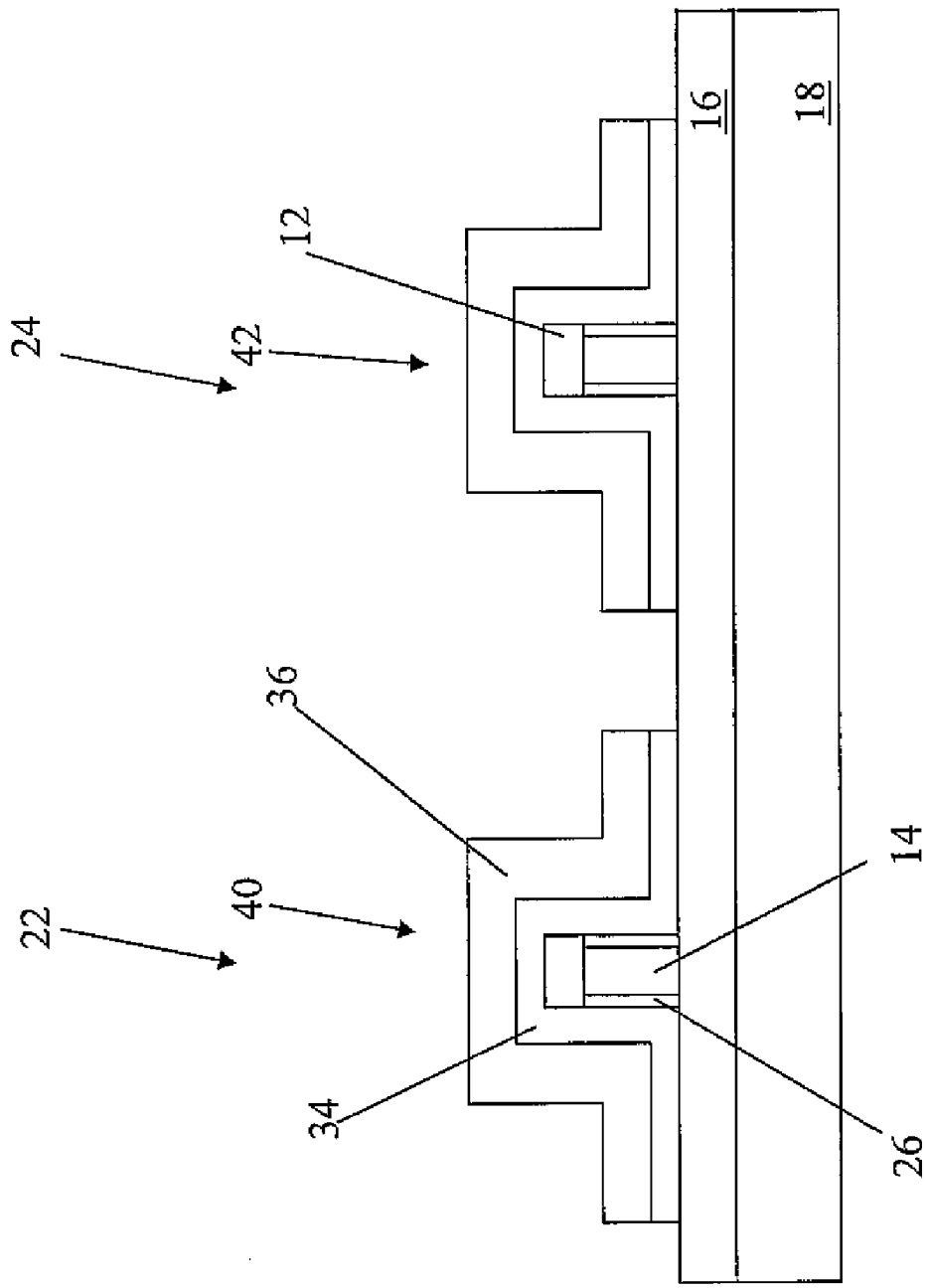

In a next process, as shown in FIGS. 5A-5B, portions of polysilicon layer 34 and polysilicon germanium layer 36 left unexposed by photoresist mask 38 (FIG. 5A only) are removed, for example, using RIE. The etching extends through polysilicon layer 34 and polysilicon germanium layer 36, and stops at silicon nitride cap 12 and buried insulator layer 16. Photoresist mask 38 (FIG. 5A only) is then removed for example, using an oxygen ($O_2$) ash or solvent strip.

Figure 6A:
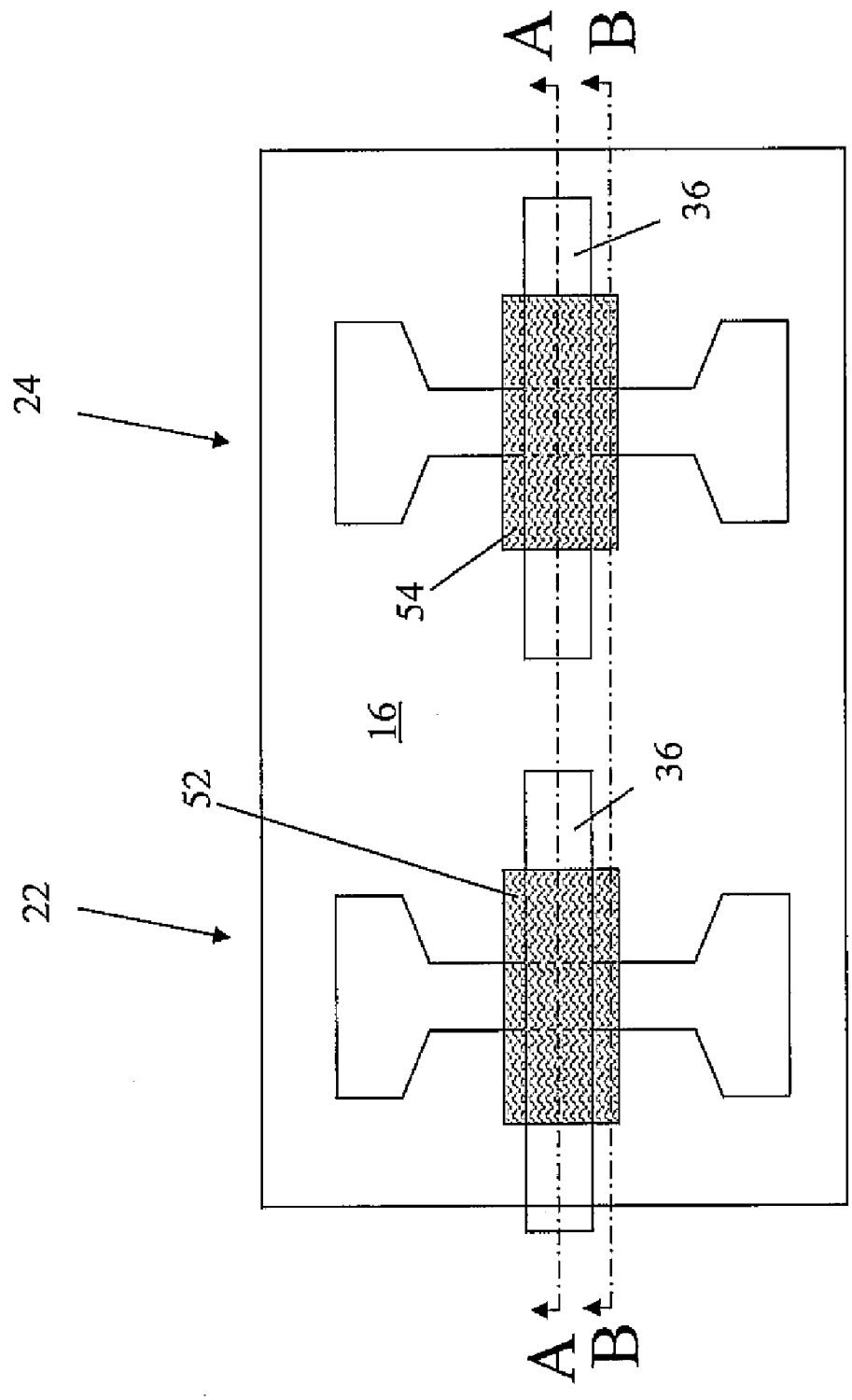

As shown in FIG. 5A, after patterning gate stacks 40 and 42, source/drain (S/D) regions 44, 46, 48, 50 may be formed adjacent to each fin 22, 24 using any known or later developed technique. As is known in the art, S/D regions may comprise halo and extension regions (not shown). As shown in FIGS. 6A-B, spacers 52, 54 are also formed adjacent to each fin 22, 24 using any known or later developed technique. Spacers 52, 54 can comprise any suitable dielectric material, such as silicon dioxide, silicon nitride, or a composite of silicon dioxide and silicon nitride. However, in a preferred embodiment, spacers 52, 54 include silicon nitride.

Figure 7A:
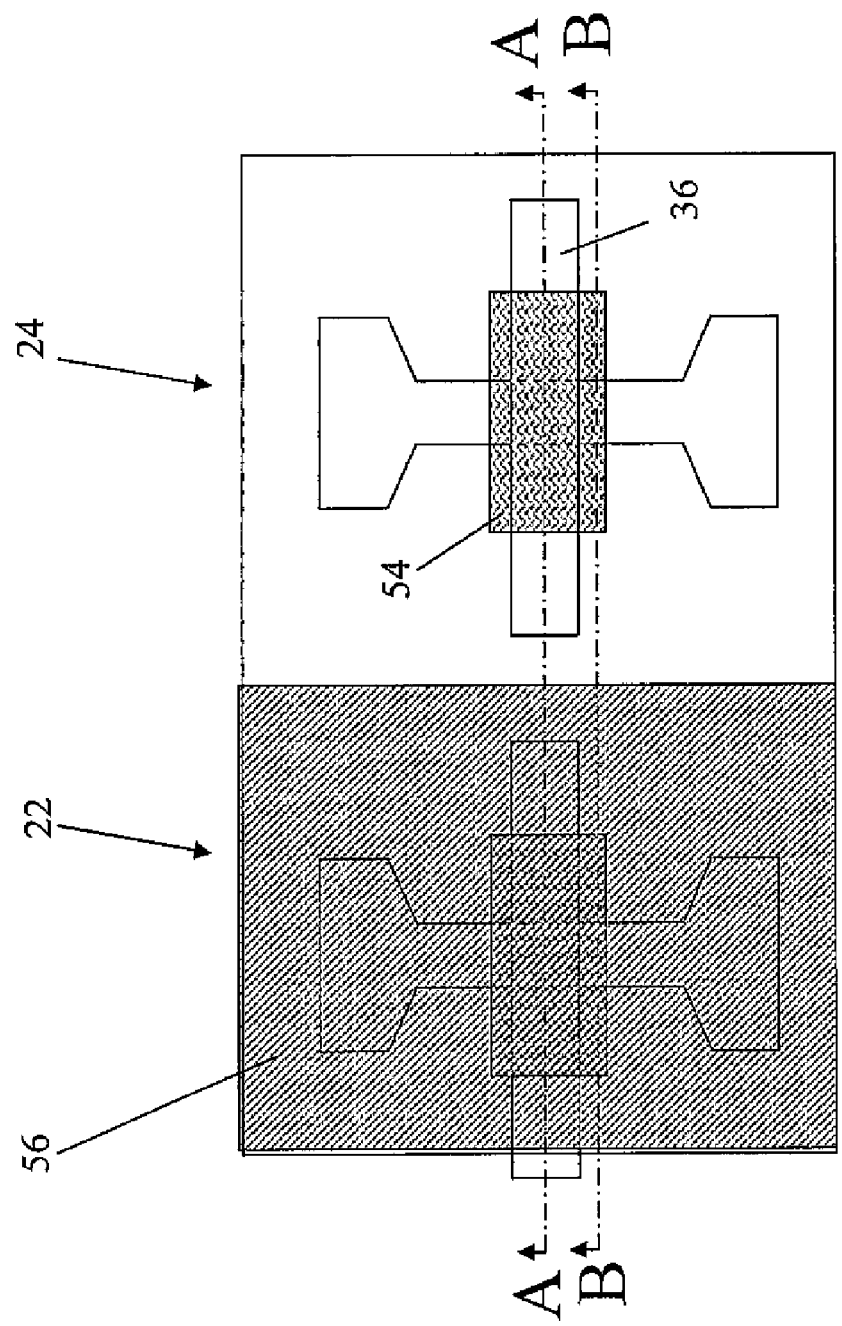
Figure 7B:
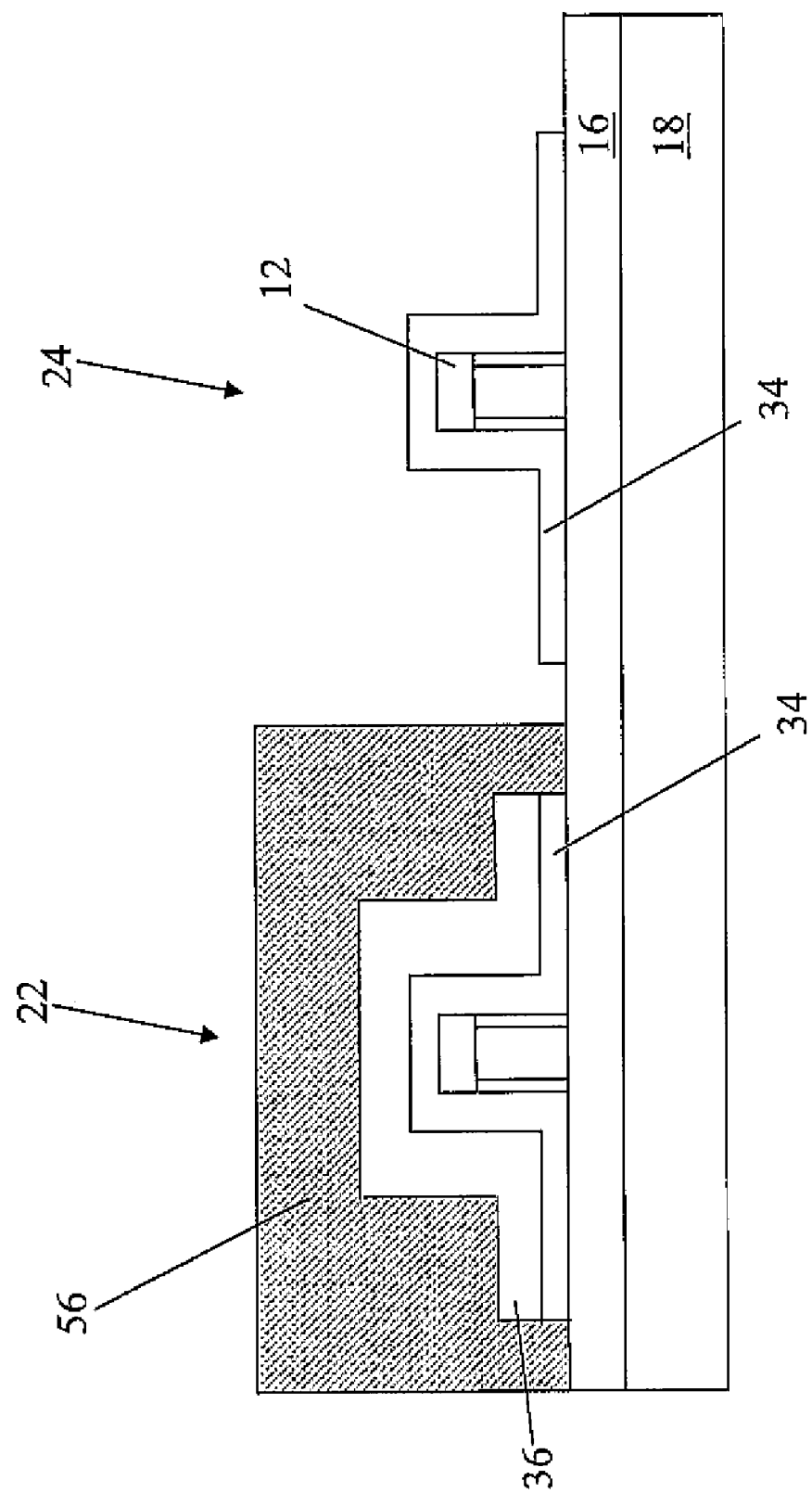
Figure 8:
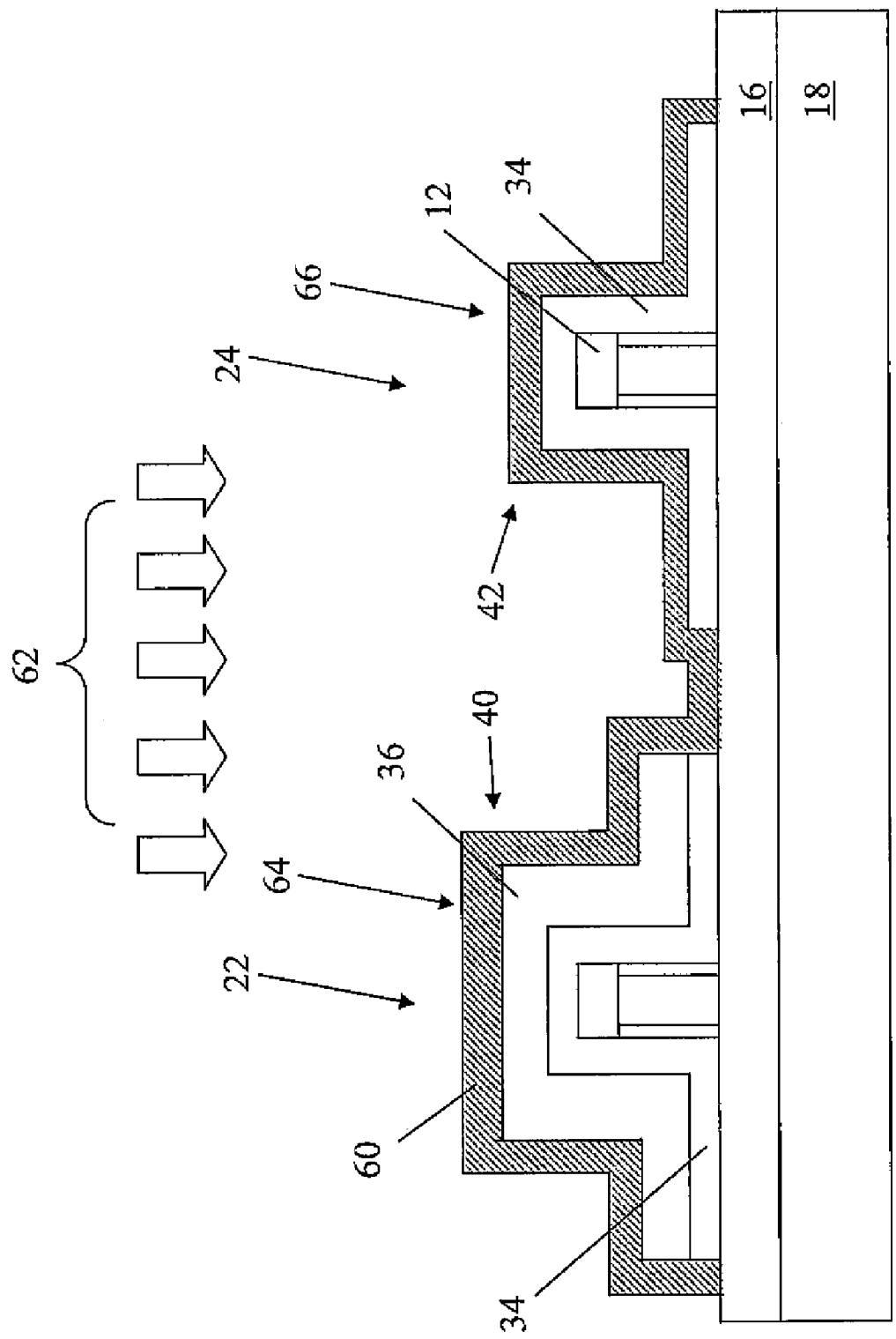

In a next process, as shown in FIGS. 7A-7B, first fin 22 is completely covered by photoresist mask 56, while second fin 24 is left uncovered. The device is etched and polysilicon germanium layer 36 is removed over exposed fin 24. The etching extends through polysilicon germanium layer 36 and stops at polysilicon layer 34. In this case, polysilicon germanium layer 36 may be removed using an isotropic etch. As shown in FIG. 8, after etching is complete, the thickness of gate stack 40 over fin 22 is thicker than gate stack 42 over fin 24 due to remaining polysilicon germanium layer 36 over fin 22.

Figure 9:
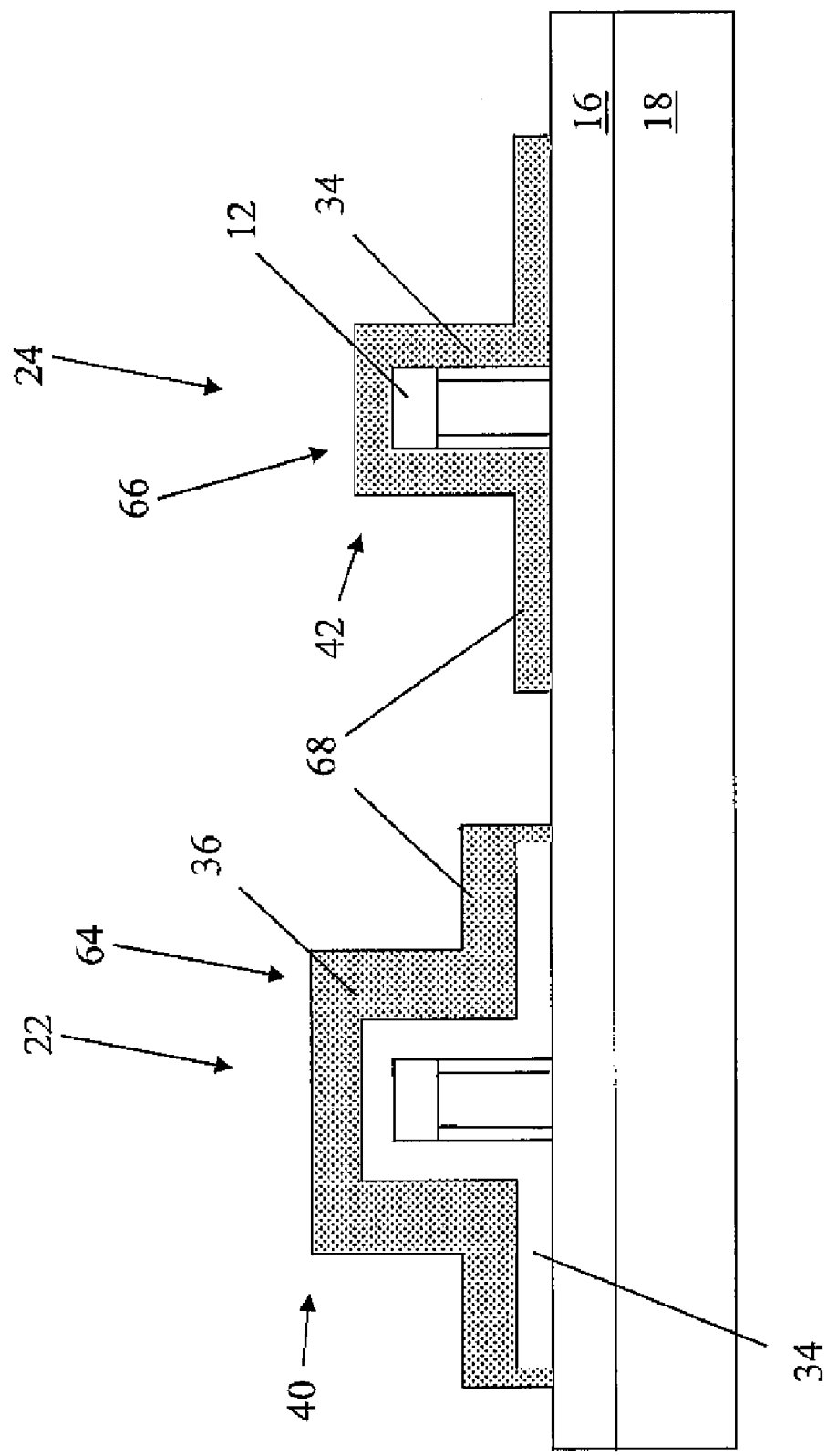

As shown in FIGS. 8-9, photoresist 56 is removed and a S/D anneal is initiated to activate the dopants. Metal layer 60 is then formed over both fins 22, 24 and annealed (shown as arrows 62) to form fully silicided gates 64, 66 over first fin 22 and second fin 24, respectively, wherein fully silicided gate 66 over second fin 24 is metal rich, i.e., the ratio of metal to silicide is greater than 1. During the annealing process, the FinFet device is heated to a reaction temperature for a period of time, causing metal layer 60 to react with the Si and SiGe that metal layer 60 contacts, thus forming silicide layer 68 (FIG. 9) interfacing with remaining poly-silicon-germanium layer 36 over first fin 22 and with remaining polysilicon layer 34 over second fin 24. In this case, gate stack 40, including polysilicon germanium layer 36, is thicker than gate stack 42. Thus, more reactant is required from metal layer 60 to fully silicide polysilicon layer 34 as compared to gate stack 42. In one embodiment, metal layer 60 is made from nickel. Therefore, annealing metal layer 60 over gate stack 42 forms nickel rich fully silicided nickel-silicon layer 68 for gate stack 42 to move the work function of gate stack 42 toward the valence band. Annealing metal layer 60 over gate stack 40 forms fully silicided nickel-silicon layer 68 for gate stack 40 to move the work function of gate stack 40 toward the conduction band. Therefore, desired threshold voltages for both fins 22, 24 are obtained.

Furthermore, multiple annealing processes may be employed. In this case, annealing 62 comprises: annealing 62 at a first temperature; removing any un-reacted metal from metal layer 60 over both fins; and annealing at a second temperature, wherein the second temperature is higher than the first temperature. In one embodiment, the temperature of the first anneal is between 300 and 350° C. and the temperature of the second anneal is between 400 and 500° C. The un-reacted metal may be removed using a conventional wet chemical etch. Furthermore, metal layer 60 is made from nickel, although various other metals that react with silicon to form a silicide may be used including but not limited to Co, Ni, Pt, Ti, and W.

While this disclosure has been described in conjunction with the specific embodiments outlined above, it is evident that many alternatives, modifications and variations will be apparent to those skilled in the art. Accordingly, the embodiments of the disclosure as set forth above are intended to be illustrative, not limiting. Various changes may be made without departing from the spirit and scope of the disclosure as defined in the following claims It is understood that the order of the above-described process is only illustrative. To this extent, one or more processes can be performed in parallel, in a different order, at a remote time, etc. Further, one or more of the processes may not be performed in various embodiments of the disclosure.

What is claimed is:

1. A method comprising:
providing a semiconductor-on-insulator (SOI) substrate having a first fin and a second fin formed from a SOI layer of the SOI substrate;
forming a first polysilicon layer over each of the fins;
forming a polysilicon germanium layer over the first polysilicon layer;
patterning a gate stack over each fin from the first polysilicon layer and the polysilicon germanium layer;
removing the polysilicon germanium layer over the first fin;
forming a metal layer over both fins; and
annealing to form a fully silicided gate over the first fin and the second fin, wherein the fully silicided gate over the second fin is metal rich.

2. The method of claim 1, wherein the providing the SOI substrate comprises:
forming a silicon nitride cap over the substrate;
forming a mask over the nitride cap;
patterning the silicon nitride cap using the mask;
removing the mask over the silicon nitride cap; and
forming a gate oxide layer over the fins.

3. The method of claim 2, wherein each fin includes the silicon nitride cap and oxidized sidewalls, and wherein the SOI substrate includes a buried insulator layer.

4. The method of claim 1, further comprising forming a source region and a drain region adjacent to each fin.

5. The method of claim 1, further comprising forming a spacer adjacent to each fin.

6. The method of claim 5, wherein the spacer includes silicon nitride.

7. The method of claim 1, wherein the annealing comprises:
annealing at a first temperature;
removing any un-reacted metal from the metal layer over both fins; and
annealing at a second temperature, wherein the second temperature is higher than the first temperature.

8. The method of claim 7, wherein the metal layer includes nickel.

9. The method of claim 1, wherein the fully silicided gate over the first fin includes nickel-silicide, and wherein the fully silicided gate over the second fin includes nickel rich nickel-silicide.

10. The method of claim 1, wherein the removing includes an anisotropic etch.

* * * * *